(12) United States Patent
Cho et al.

(10) Patent No.: US 12,224,174 B2
(45) Date of Patent: Feb. 11, 2025

(54) STACKED STRUCTURE INCLUDING SEMICONDUCTOR STRUCTURE AND METHOD OF MANUFACTURING THE SAME

(71) Applicants: Samsung Display Co., LTD., Yongin-si (KR); Industry-Academic Cooperation Foundation, Yonsei University, Seoul (KR)

(72) Inventors: Mann Ho Cho, Seoul (KR); Kwang Sik Jeong, Seoul (KR); Hyeon Sik Kim, Gumi-si (KR); Hyun Eok Shin, Gwacheon-si (KR); Byung Soo So, Yongin-si (KR); Ju Hyun Lee, Seongnam-si (KR)

(73) Assignees: SAMSUNG DISPLAY CO., LTD., Yongin-si (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 18/502,583

(22) Filed: Nov. 6, 2023

(65) Prior Publication Data

US 2024/0071757 A1    Feb. 29, 2024

Related U.S. Application Data

(62) Division of application No. 17/469,279, filed on Sep. 8, 2021, now Pat. No. 11,837,468.

(30) Foreign Application Priority Data

Oct. 26, 2020    (KR) .......................... 10-2020-0139177

(51) Int. Cl.
*H01L 21/02*    (2006.01)
(52) U.S. Cl.
CPC .. *H01L 21/02491* (2013.01); *H01L 21/02422* (2013.01); *H01L 21/02502* (2013.01); *H01L 21/0254* (2013.01)
(58) Field of Classification Search
CPC ......... H01L 21/02491; H01L 21/02422; H01L 21/02502; H01L 21/0254; H01L 33/40;
(Continued)

(56) References Cited

U.S. PATENT DOCUMENTS 5,654,235 A    8/1997    Matsumoto et al.
7,994,527 B2   8/2011    Denbaars et al.
(Continued)

FOREIGN PATENT DOCUMENTS

| EP | 1 502 286 | 10/2008 |
| EP | 1 299 900 | 12/2012 |
| KR | 10-2007-0116687 | 12/2007 |

*Primary Examiner* — Julia Slutsker
(74) *Attorney, Agent, or Firm* — KILE PARK REED & HOUTTEMAN PLLC

(57) ABSTRACT

A method of manufacturing a stacked structure includes forming a first metal buffer layer including crystal grains on a base substrate, forming a second metal buffer material layer on the first metal buffer layer, and crystallizing the second metal buffer material layer to form a second metal buffer layer, wherein the second metal buffer material layer includes crystal grains, and a density of the crystal grains of the second metal buffer material layer is lower than a density of the crystal grains of the first metal buffer layer.

5 Claims, 18 Drawing Sheets

(58) Field of Classification Search
CPC ............ H01L 33/62; H01L 2933/0016; H01L 2933/0066; H01L 21/02513; H01L 33/005; H01L 33/12; H01L 2933/0008; H01L 31/00; H01L 31/0256; H01L 31/036; H01L 31/0384

See application file for complete search history.

(56) References Cited

U.S. PATENT DOCUMENTS

| | | |
|---|---|---|
| 8,865,489 B2 | 10/2014 | Rogers et al. |
| 2004/0099918 A1 | 5/2004 | Noguchi et al. |
| 2008/0271781 A1 | 11/2008 | Kushiya et al. |
| 2021/0343780 A1 | 11/2021 | Long |

FIG. 5
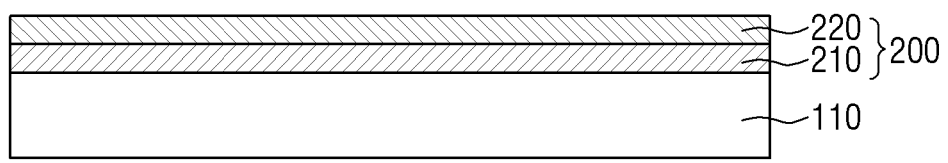
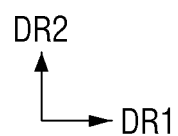

FIG. 11
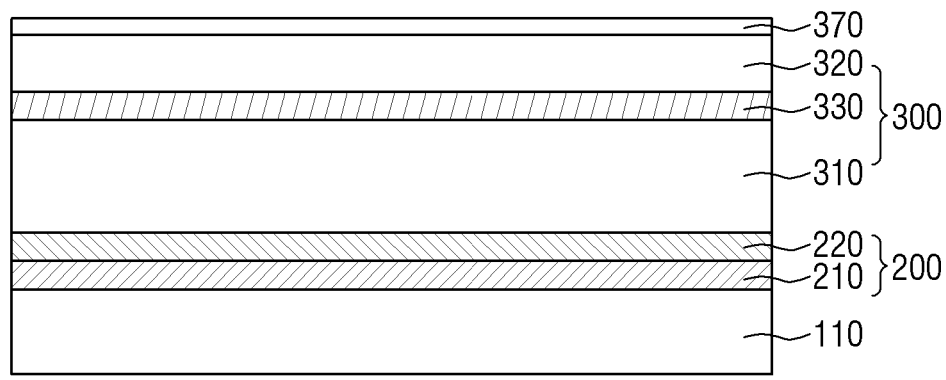
10: 110, 200, 300
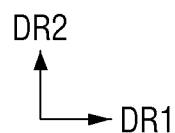

FIG. 12
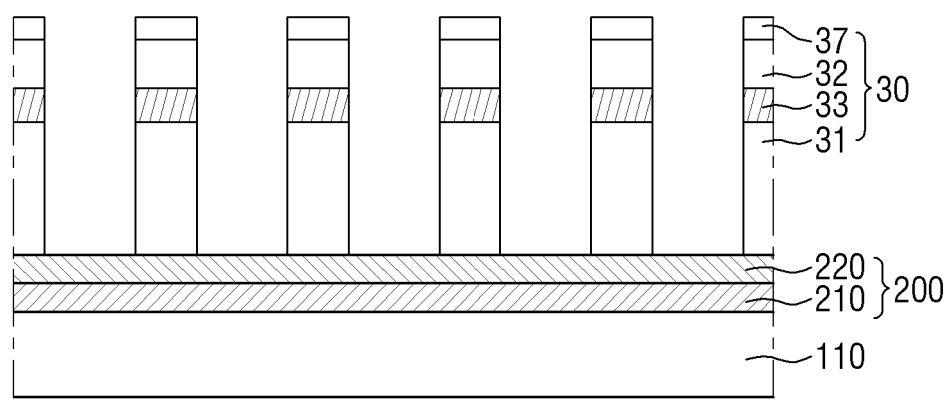
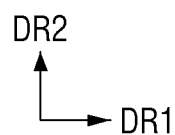

FIG. 18
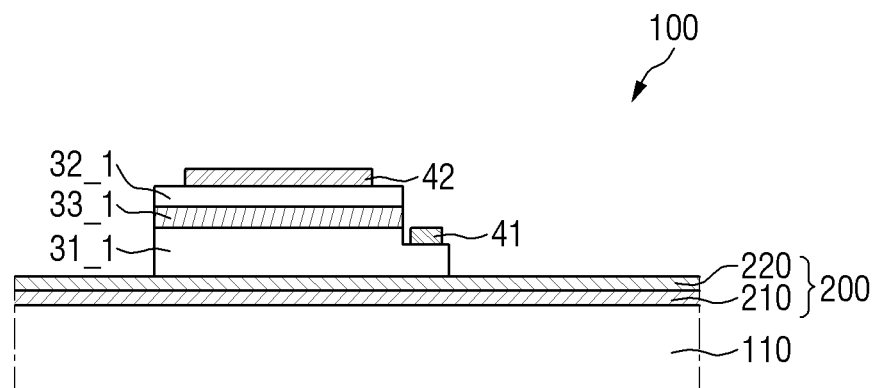
ED2: 31_1, 32_1, 33_1, 41, 42
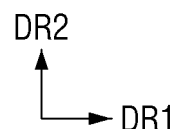

FIG. 19
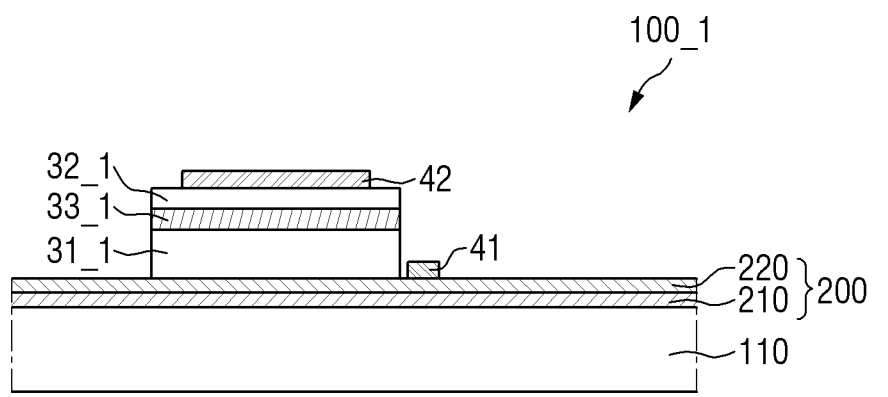
ED2_1: 31_1, 32_1, 33_1, 41, 42
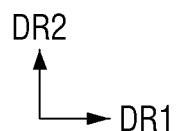

STACKED STRUCTURE INCLUDING SEMICONDUCTOR STRUCTURE AND METHOD OF MANUFACTURING THE SAME

CROSS-REFERENCE TO RELATED APPLICATION(S)

This is a divisional application of U.S. patent application Ser. No. 17/469,279 filed Sep. 8, 2021, the disclosure of which is incorporated herein by reference in its entirety. U.S. patent application Ser. No. 17/469,279 claims priority to and benefits of Korean Patent Application No. 10-2020-0139177 under 35 U.S.C. § 119, filed Oct. 26, 2020, in the Korean Intellectual Property Office, the entire contents of which are incorporated herein by reference.

BACKGROUND

1. Technical Field

The disclosure relates to a stacked structure including a semiconductor structure and a method of manufacturing the same.

2. Description of the Related Art

Gallium Nitride (GaN) is a typical binary group 3-5 semiconductor, and may generally be used for light emitting devices and power devices. Since GaN has a band gap of about 3.5 eV and may thus be capable of emitting purple light of about 405 nm, GaN may be an element essential for manufacturing white light emitting devices. Further, GaN is also expected to be applied to high-temperature devices and high-power devices due to its stability at high temperatures, high thermal conductivity, and high breakdown voltage characteristics.

Currently, in the growth of commercially available GaN, there is a method of forming a buffer layer on a sapphire (0001) substrate and growing GaN on the buffer layer by metal organic chemical vapor deposition MOCVD. Recently, research on growing GaN at low temperatures using PVD methods such as sputtering and pulsed laser deposition (PLD), which can be performed at lower process temperature than a high-temperature process (>about 1000° C.) of MOCVD, have been conducted.

Since GaN may be grown at low temperatures (<about 800° C.) it may be possible to introduce glass substrates used in displays. In order to grow GaN on an amorphous substrate by an MOCVD method, a high-purity quartz substrate withstanding the high temperature process (>about 1000° C.) of MOCVD may be essential. However, the price of a quartz substrate may be higher than that of a glass or reinforced glass substrate commonly used in display industries. Accordingly, development of a technology for growing GaN on an amorphous substrate at a low temperature makes it possible to drastically reduce the processing cost of GaN.

However, when GaN is directly grown on an amorphous substrate, GaN may have high defect density, and thus GaN may be difficult to use commercially. In order to grow high-quality GaN, a substrate or buffer layer uniaxially aligned and having little lattice mismatch with GaN may be essential. However, since a general buffer layer may be grown based on the lattice structure of a base substrate, it may be impossible to grow a uniaxially aligned buffer layer or GaN on an amorphous substrate. Accordingly, it may be necessary to develop a buffer layer that can be uniaxially aligned on an amorphous substrate regardless of the crystal structure of the base substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the disclosure may be to provide a method of manufacturing a stacked structure including a semiconductor structure on an amorphous substrate using a uniaxially aligned metal buffer layer.

Another aspect of the disclosure may be to provide a stacked structure including a semiconductor structure, manufactured by the method.

According to an aspect of an embodiment, a method of manufacturing a stacked structure may include forming a first metal buffer layer including crystal grains on a base substrate, forming a second metal buffer material layer on the first metal buffer layer, and crystallizing the second metal buffer material layer to form a second metal buffer layer, wherein the second metal buffer material layer may include crystal grains, and a density of the crystal grains of the second metal buffer material layer may be lower than a density of the crystal grains of the first metal buffer layer.

In an embodiment, the forming of the second metal buffer layer may include crystallizing the second metal buffer material layer by a heat treatment process.

In an embodiment, the heat treatment process may be performed at a temperature lower than a phase transition temperature of a material included in the first metal buffer layer and a phase transition temperature of a material included in the second metal buffer material layer.

In an embodiment, the method of manufacturing the stacked structure may include doping the second metal buffer material layer with at least one of nitrogen (N), oxygen (O), and carbon (C) after the forming of the second metal buffer material layer.

In an embodiment, the method of manufacturing the stacked structure may include heat-treating the first metal buffer layer after the forming of the first metal buffer layer.

In an embodiment, the method of manufacturing the stacked structure may include doping the first metal buffer layer with at least one of N, O, and C before the heat treating of the first metal buffer layer.

In an embodiment, the forming of the first metal buffer layer may be performed through a sputtering process by applying a first power, the forming of the second metal buffer material layer may be performed through another sputtering process by applying a second power, and the first power may be higher than the second power.

In an embodiment, the sputtering process and the another sputtering process may be performed through at least one of a pulsed DC (direct current) power and a RF (radio frequency) power.

In an embodiment, the base substrate may include an amorphous substrate.

In an embodiment, the amorphous substrate may include a glass substrate.

In an embodiment, the first metal buffer layer may include at least one of beryllium (Be), aluminum (Al), scandium (Sc), titanium (Ti), vanadium (V), chromium (Cr), manganese (Mn), iron (Fe), cobalt (Co), nickel (Ni), copper (Cu), zinc (Zn), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), hafnium (Hf), tantalum (Ta), tungsten (W), rhenium (Re), osmium (Os), lawrencium (Lr), platinum (Pt), gold (Au), mercury (Hg), lead (Pb), thallium (Tl), a combination thereof, and a nitride thereof.

In an embodiment, the second metal buffer layer may include at least one of Be, Al, Sc, Ti, V, Cr, Mn, Fe, Co, Ni, Cu, Zn, Sr, Y, Zr, Nb, Mo, Tc, Ru, Rh, Pd, Ag, Cd, In, Sn, Sb, Hf, Ta, W, Re, Os, Lr, Pt, Au, Hg, Pb, Tl, a combination thereof, and a nitride thereof.

In an embodiment, the method of manufacturing the stacked structure may include forming a semiconductor structure on the second metal buffer layer, wherein the semiconductor structure includes a first semiconductor layer formed on the second metal buffer layer, an active layer formed on the first semiconductor layer, and a second semiconductor layer formed on the active layer.

In an embodiment, the first semiconductor layer may be grown at a temperature of about 700° C. or below by a physical vapor deposition (PVD) method.

In an embodiment, the second metal buffer layer may have a hexagonal crystal structure.

According to an aspect of another embodiment, a stacked structure may include an amorphous substrate, a first metal buffer layer disposed on the amorphous substrate, a second metal buffer layer disposed on the first metal buffer layer, and a semiconductor structure disposed on the second metal buffer layer, wherein the semiconductor structure may include a first semiconductor layer disposed on the second metal buffer layer, an active layer disposed on the first semiconductor layer, and a second semiconductor layer disposed on the active layer.

In an embodiment, the amorphous substrate may include a glass substrate.

In an embodiment, the first metal buffer layer may include at least one of Be, Al, Sc, Ti, V, Cr, Mn, Fe, Co, Ni, Cu, Zn, Sr, Y, Zr, Nb, Mo, Tc, Ru, Rh, Pd, Ag, Cd, In, Sn, Sb, Hf, Ta, W, Re, Os, Lr, Pt, Au, Hg, Pb, Tl, a combination thereof, and a nitride thereof.

In an embodiment, the second metal buffer layer may include at least one of Be, Al, Sc, Ti, V, Cr, Mn, Fe, Co, Ni, Cu, Zn, Sr, Y, Zr, Nb, Mo, Tc, Ru, Rh, Pd, Ag, Cd, In, Sn, Sb, Hf, Ta, W, Re, Os, Lr, Pt, Au, Hg, Pb, Tl, a combination thereof, and a nitride thereof.

In an embodiment, the second metal buffer layer may have a hexagonal crystal structure.

However, aspects of the disclosure are not restricted to those set forth herein. The above and other aspects of the disclosure will become more apparent to one of ordinary skill in the art to which the disclosure pertains by referencing the detailed description of the disclosure given below.

BRIEF DESCRIPTION OF THE DRAWINGS

The above and other aspects and features of the disclosure will become more apparent by describing in detail embodiments thereof with reference to the attached drawings, in which:

FIGS. 3 to 7 are schematic cross-sectional views illustrating a process of manufacturing a stacked structure according to an embodiment;

FIGS. 11 to 15 are schematic cross-sectional views illustrating a process of manufacturing the first light emitting element of FIG. 10;

FIG. 18 is an enlarged schematic cross-sectional view illustrating an example of a light source member included in a display device according to an embodiment; and FIG. 19 is an enlarged schematic cross-sectional view illustrating another example of a light source member included in a display device according to an embodiment.

DETAILED DESCRIPTION OF THE EMBODIMENTS

Figure 1:
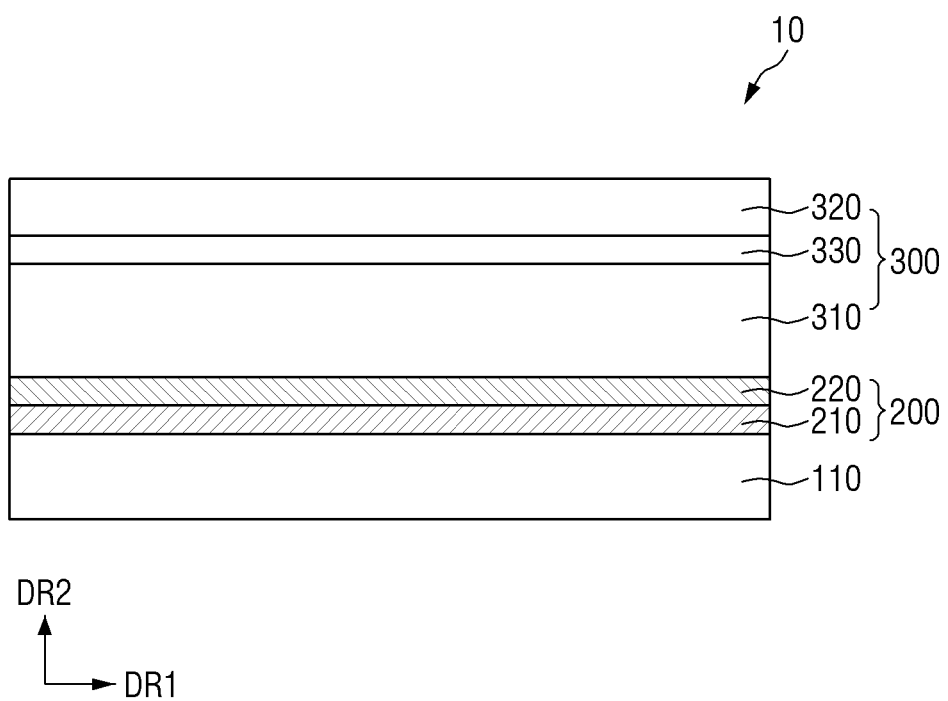
FIG. 1 is a schematic cross-sectional view of a stacked structure including a semiconductor structure according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

When a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a stacked structure including a semiconductor structure according to an embodiment.

Referring to FIG. 1, a stacked structure 10 according to an embodiment may include a base substrate 110, a metal buffer layer 200, and a semiconductor structure 300. The metal buffer layer 200 may include a first metal buffer layer 210 and a second metal buffer layer 220. The semiconductor structure 300 may include a first semiconductor layer 310, an active layer 330, and a second semiconductor layer 320.

The base substrate 110 may include an amorphous substrate. For example, the base substrate 110 may include glass, plastic, or the like as an amorphous substrate. In an embodiment, the base substrate 110 may include a glass substrate.

The metal buffer layer 200 may be disposed on the base substrate 110. Specifically, the metal buffer layer 200 may be disposed on a surface (for example, upper surface in the drawing) of the base substrate 110. The metal buffer layer 200 may include a first metal buffer layer 210 and a second metal buffer layer 220.

The first metal buffer layer 210 may be disposed on a surface (for example, upper surface in the drawing) of the base substrate 110. The first metal buffer layer 210 may be formed to reduce a difference in lattice constant between the base substrate 110 and the first semiconductor layer 310 of the semiconductor structure 300. For example, even in case that the base substrate 110 is an amorphous substrate, the first metal buffer layer 210 having crystal grains may be formed on the base substrate 110, so that a difference in lattice constant between the base substrate 110 and the first semiconductor layer 310 (to be described later) may be reduced. The first metal buffer layer 210 may include a material capable of having a structure that has crystal grains and may be self-aligned and oriented in a single direction on the base substrate 110, which may be an amorphous substrate having no crystal structure. The first metal buffer layer 210 may include a material having a hexagonal close packed (HCP) crystal structure in consideration of the crystal structure of the first semiconductor layer 310 of the semiconductor structure 300 to be described later.

In an embodiment, the first metal buffer layer 210 may include a metal material capable of self-alignment in a single orientation. For example, the first metal buffer layer 210 may include beryllium (Be), aluminum (Al), scandium (Sc), titanium (Ti), vanadium (V), chromium (Cr), manganese (Mn), iron (Fe), cobalt (Co), nickel (Ni), copper (Cu), zinc (Zn), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), hafnium (Hf), tantalum (Ta), tungsten (W), rhenium (Re), osmium (Os), lawrencium (Lr), platinum (Pt), gold (Au), mercury (Hg), lead (Pb), thallium (Tl), a combination thereof, or a nitride thereof, but the material thereof is not limited thereto.

The second metal buffer layer 220 may be disposed on the first metal buffer layer 210. The second metal buffer layer 220 may serve to improve the crystallinity of the first semiconductor layer 310 by reducing a difference in lattice constant between the base substrate 110 and the first semiconductor layer 310 of the semiconductor structure 300. The second metal buffer layer 220 may be a seed layer for forming the first semiconductor layer 310 of the semiconductor structure 300 to be described later.

In an embodiment in which the second metal buffer layer 220 may be formed on the first metal buffer layer 210 having a hexagonal close packed (HCP) crystal structure, similarly to the first metal buffer layer 210, the second metal buffer layer 220 may have a hexagonal close packed (HCP) crystal structure. Since the first and second metal buffer layers 210 and 220 have a hexagonal close packed (HCP) crystal structure, the crystallinity of the first semiconductor layer 310 of the semiconductor structure 300 may be improved. However, the disclosure is not limited thereto, and at least one of the first and second metal buffer layers 210 and 220 may have a face centered cubic (FCC) crystal structure.

In an embodiment, the second metal buffer layer 220 may include Be, Al, Sc, Ti, V, Cr, Mn, Fe, Co, Ni, Cu, Zn, Sr, Y, Zr, Nb, Mo, Tc, Ru, Rh, Pd, Ag, Cd, In, Sn, Sb, Hf, Ta, W, Re, Os, Lr, Pt, Au, Hg, Pb, Tl, a combination thereof, or a nitride thereof, but the material thereof is not limited thereto.

The semiconductor structure 300 may be disposed on the metal buffer layer 200. The semiconductor structure 300 may be disposed on a surface of the second metal buffer layer 220. The semiconductor structure 300 may include a first semiconductor layer 310, an active layer 330, and a second semiconductor layer 320.

The first semiconductor layer 310 may be disposed on the second metal buffer layer 220. The first semiconductor layer 310 may be formed by growing on the second metal buffer layer 220 by an epitaxial method.

The first semiconductor layer 310 may include a semiconductor material having a formula of $Al_xGa_yIn_{1-x-y}N$ ($0 \leq x \leq 1$, $0 \leq y \leq 1$, $0 \leq x+y \leq 1$). For example, the first semiconductor layer 310 may include at least one of AlGaInN, GaN, AlGaN, InGaN, AlN, and InN. The first semiconductor layer 310 may include Gallium Nitride (GaN), and GaN may be at least one of GaN doped with a n-type dopant, GaN doped with a p-type dopant, and undoped GaN.

In an embodiment, the first semiconductor layer 310 may include an n-type semiconductor having a first conductivity type. For example, the first semiconductor layer 310 may include at least one of AlGaInN, GaN, AlGaN, InGaN, AlN, and InN, which may be doped with an n-type dopant. The first semiconductor layer 310 may be doped with a first conductive dopant. For example, the first conductive dopant may be Silicon (Si), Germanium (Ge), or Tin (Sn). In an embodiment, the first semiconductor layer 310 may be n-GaN doped with n-type Si, but is not limited thereto.

In some embodiments, the first semiconductor layer 310 may include an undoped semiconductor, and the undoped semiconductor may be a material not doped with an n-type or p-type dopant. For example, the first semiconductor layer 310 may include GaN not doped with an n-type or p-type dopant.

The active layer 330 may be disposed on the first semiconductor layer 310. The active layer 330 may include a material having a single or multiple quantum well structure. In case that the active layer 330 includes a material having a multiple quantum well structure, the active layer 330 may have structure in which quantum layers and well layers may be alternately stacked with each other.

The active layer 330 may emit light by combination of an electron-hole pair according to an electric signal applied through the first semiconductor layer 310 and the second semiconductor layer 320. For example, in case that the active layer 330 emits light of a blue wavelength band, the active layer 330 may include a material such as AlGaN or AlGaInN. In particular, in case that the active layer 330 has a multiple quantum well structure in which quantum layers and well layers may be alternately stacked, the quantum layer may include a material such as AlGaN or AlGaInN, and the well layer may include a material such as GaN or AlInN. In an embodiment, the active layer 330 may include quantum layers including AlGaInN and well layers including AlInN, and may emit blue light having a center wavelength band ranging from about 450 nm to about 495 nm.

However, the disclosure is not limited thereto, and the active layer 330 may have a structure in which semiconductor materials having high band gap energy and semiconductor materials having low band gap energy may be alternately stacked with each other, and may include other Group 3 to Group 5 semiconductor materials depending on the wavelength band of emitted light. The light emitted by the active layer 330 may not be limited to light of a blue wavelength band, and in some cases, light of a red wavelength band or light of a green wavelength band may be emitted.

The second semiconductor layer 320 may be disposed on the active layer 330. The second semiconductor layer 320 may include a semiconductor material having a formula of $Al_xGa_yIn_{1-x-y}N$ ($0 \leq x \leq 1$, $0 \leq y \leq 1$, $0 \leq x+y \leq 1$). For example, the second semiconductor layer 320 may include at least one of AlGaInN, GaN, AlGaN, InGaN, AlN, and InN. The second semiconductor layer 320 may include GaN, and GaN may be at least one of GaN doped with a n-type dopant, GaN doped with a p-type dopant, and undoped GaN.

In an embodiment, the second semiconductor layer 320 may include a p-type semiconductor having a second conductivity type. For example, the second semiconductor layer 320 may include at least one of AlGaInN, GaN, AlGaN, InGaN, AlN, and InN, which may be doped with a p-type dopant. The second semiconductor layer 320 may be doped with a second conductive dopant. For example, the second conductive dopant may be Mg, Zn, Ca, Se, or Ba. In an embodiment, the second semiconductor layer 320 may be n-GaN doped with p-type Mg, but is not limited thereto.

Although it is shown in the drawings that each of the first semiconductor layer 310 and the second semiconductor layer 320 is configured as one layer, the disclosure is not limited thereto. In some embodiments, each of the first semiconductor layer 310 and the second semiconductor layer 320 may include a larger number of layers, for example, clad layers or tensile strain barrier reducing (TSBR) layers.

Hereinafter, a process of manufacturing a stacked structure including a semiconductor structure according to an embodiment will be described with reference to FIGS. 1 to 7.

Figure 2:
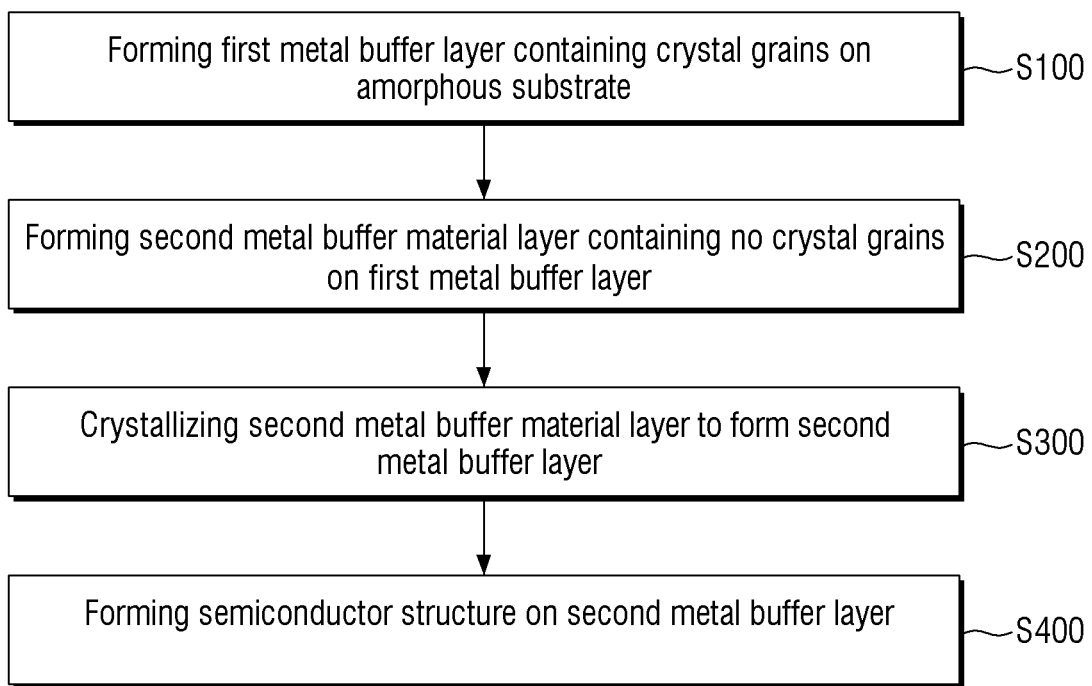
FIG. 2 is a flowchart illustrating a method of manufacturing a stacked structure including a semiconductor structure according to an embodiment.

FIG. 2 is a flowchart illustrating a method of manufacturing a stacked structure including a semiconductor structure according to an embodiment. FIGS. 3 to 7 are schematic cross-sectional views illustrating a process of manufacturing a stacked structure according to an embodiment.

Referring to FIG. 2, a method of manufacturing a stacked structure 10 including a semiconductor structure 300 according to an embodiment may include forming a first metal buffer layer 210 on a base substrate 110 (S100), forming a second metal buffer material layer 220' on the first metal buffer layer 210 (S200), crystallizing the second metal buffer material layer 220' to form a second metal buffer layer 220 (S300), and forming a semiconductor structure 300 on the second metal buffer layer 220 (S400).

First, a first metal buffer layer 210 may be formed on abase substrate 110 (S100 in FIG. 2).

Figure 3:
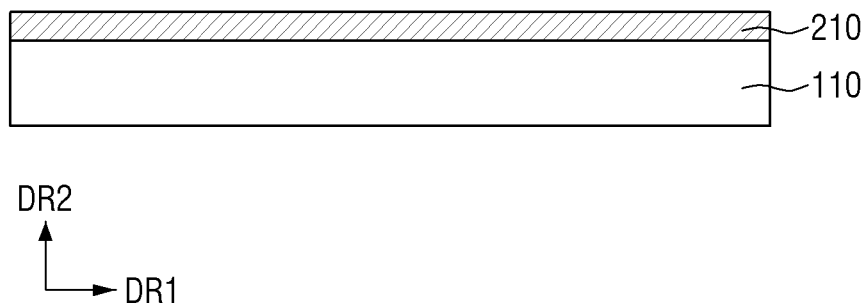

Specifically, referring to FIG. 3, the base substrate 110 may include an amorphous substrate. As described above, the base substrate 110 may include a glass substrate as the amorphous substrate.

The first metal buffer layer 210 having crystal grains may be formed on the base substrate 110. The grain density of crystal grains included in the first metal buffer layer 210 may have a first density. In the specification, the density of crystal grains may be understood as the number of grains included per unit volume. The first metal buffer layer 210 may include a material capable of having a structure that has crystal grains and may be self-aligned and oriented in a single direction on the base substrate 110, which may be an amorphous substrate having no crystal structure. The first metal buffer layer 210 may include a material having a hexagonal close packed (HCP) crystal structure in consideration of the crystal structure of the first semiconductor layer 310 of the semiconductor structure 300 to be described later. The first metal buffer layer 210 may be formed to have a HCP crystal structure suitable for the epitaxial method of the first semiconductor layer 310 formed on the second metal buffer layer 220 and the second metal buffer layer 220, thereby improving the quality of the semiconductor structure. For example, the first metal buffer layer 210 may include Be, Al, Sc, Ti, V, Cr, Mn, Fe, Co, Ni, Cu, Zn, Sr, Y, Zr, Nb, Mo, Tc, Ru, Rh, Pd, Ag, Cd, In, Sn, Sb, Hf, Ta, W, Re, Os, Lr, Pt, Au, Hg, Pb, Tl, a combination thereof, or a nitride thereof, but the material thereof is not limited thereto. The first metal buffer layer 210 may include Ti or TiN, but the material thereof is not limited thereto.

The first metal buffer layer 210 may be formed on a surface of the base substrate 110 by a method such as sputtering, vacuum deposition, or plasma laser deposition (PLD). In an embodiment, the first metal buffer layer 210 may be formed by sputtering, but the disclosure is not limited thereto. In order to have a structure in which the first metal buffer layer 210 may be oriented in a single direction with predetermined crystal grains on the base substrate 110, which may be an amorphous substrate, process conditions of a sputtering process may be adjusted. For example, sputtering of the first metal buffer layer 210 may be performed by first DC power. For example, the first metal buffer layer 210 may include Ti, and the first DC power may be about 200 W.

Although not shown in the drawing, the first metal buffer layer 210 may be formed on a surface of the base substrate 110, and a heat treatment process may be further performed to improve the crystallinity of the first metal buffer layer 210. The heat treatment process may be performed at a temperature lower than the phase transition temperature of the metal material included in the first metal buffer layer 210. Since the heat treatment process may be performed at a temperature lower than the phase transition temperature of the metal material included in the first metal buffer layer 210, the crystallinity of the first metal buffer layer 210 may be improved.

Further, after the first metal buffer layer 210 may be formed on a surface of the base substrate 110, a heat treatment process performed at a high temperature may be required so as to improve the crystallinity of the first metal buffer layer 210 to obtain a desired crystal structure. After the process of forming the first metal buffer layer 210 may be performed to obtain a desired crystal structure by increasing the phase transition temperature of the metal material included in the first metal buffer layer 210, the first metal buffer layer 210 may be doped with an element such as Carbon (C), Oxygen (O), or Nitrogen (N). In case that a heat treatment process is performed after doping the first metal buffer layer 210 with an element such as C, O, or N, the phase transition temperature of the material included in the first metal buffer layer 210 may be increased, so that the heat treatment process may be performed at a high temperature, thereby obtaining a desired crystal structure.

Subsequently, a second metal buffer material layer 220' may be formed on the first metal buffer layer 210 (S200 in FIG. 2).

The second metal buffer material layer 220' may be formed on the first metal buffer layer 210. The second metal buffer material layer 220' may not include crystal grains or may include crystal grains whose distribution thereof may be smaller than a distribution of crystal grains included in the first metal buffer layer 210. The density of crystal grains included in the second metal buffer material layer 220' may have a second density. The second density may be smaller than the first density. The second metal buffer material layer 220' may include a material having a hexagonal close packed (HCP) crystal structure in consideration of the crystal structure of the first semiconductor layer 310 of the semiconductor structure 300 to be described later, but the disclosure is not limited thereto. For example, the second metal buffer material layer 220' may not have a crystal structure.

The second metal buffer material layer 220' may be formed on a surface of the first metal buffer layer 210 by a method such as sputtering, vacuum deposition, or plasma laser deposition (PLD). In an embodiment, the second metal buffer material layer 220' may be formed by sputtering, but the disclosure is not limited thereto. The second metal buffer material layer 220' may have a smaller distribution ratio of crystal grains than the first metal buffer layer 210. In order for the second metal buffer material layer 220' to have a smaller distribution ratio of crystal grains than the first metal buffer layer 210, process conditions for a sputtering process for forming the second metal buffer material layer 220' may be adjusted. For example, sputtering of the second metal buffer material layer 220' may be performed by second DC power lower than the first DC power. For example, the second metal buffer material layer 220' may include Ti, and the second DC power may be about 100 W.

Subsequently, the second metal buffer material layer 220' may be crystallized to form a second metal buffer layer 220 (S300 in FIG. 2).

Figure 4:
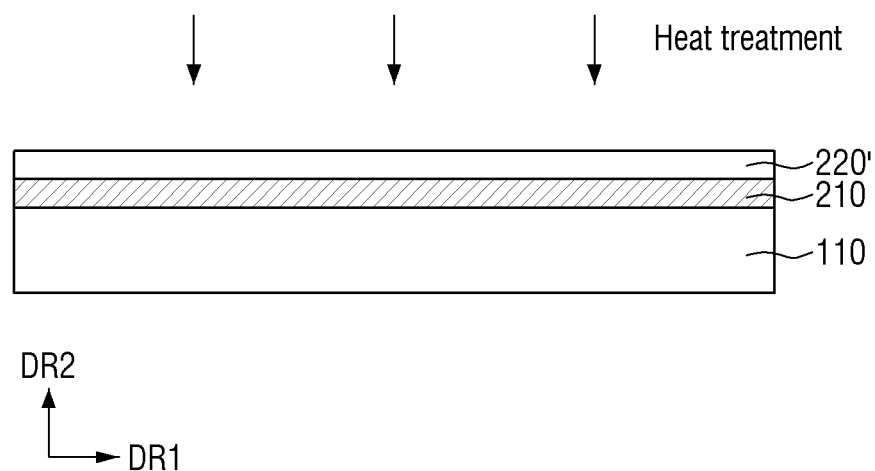

Specifically, referring to FIGS. 4 and 5, a second metal buffer layer 220 containing crystal grains as shown in FIG. 5 may be formed by crystallizing the second metal buffer material layer 220' containing little or no crystal grains. Although not limited thereto, a process of crystallizing the second metal buffer material layer 220' into the second metal buffer layer 220 may be performed through a heat treatment process. The heat treatment process may be performed at a temperature lower than the phase transition temperature of the metal material included in the second metal buffer material layer 220'. Since the heat treatment process may be performed at a temperature lower than the phase transition temperature of the metal material included in the second metal buffer material layer 220', the crystallinity of the second metal buffer material layer 220' may be improved, so that the second metal buffer layer 220 may be formed.

Although not shown in the drawings, the step of forming the second metal buffer layer 220 by crystallizing the second metal buffer material layer 220' may include a step of doping the second metal buffer material layer 220' with an element such as C, O, or N, and a step of heat-treating the doped second metal buffer material layer 220'. Specifically, in order to obtain a desired crystal structure by improving the crystallinity of the second metal buffer material layer 220', a heat treatment process performed at a high temperature may be required. After the process of forming the second metal buffer material layer 220' may be performed to obtain a desired crystal structure by increasing the phase transition temperature of the metal material included in the second metal buffer material layer 220', the second metal buffer material layer 220' may be doped with an element such as C, O, or N. In case that a heat treatment process is performed after doping the second metal buffer material layer 220' with at least one of C, O, and N, the phase transition temperature of the material included in the second metal buffer material layer 220' may be increased, so that the heat treatment process may be performed at a high temperature, thereby forming the second metal buffer layer 220 having a desired crystal structure.

Subsequently, a semiconductor structure 300 may be formed on the second metal buffer layer 220 (S400 in FIG. 2).

The step of forming the semiconductor structure 300 on the second metal buffer layer 220 may include a step of forming a first semiconductor layer 310 on the second metal buffer layer 220, a step of forming an active layer 330 on the first semiconductor layer 310, and a step of forming a second semiconductor layer 320 on the active layer 330.

Figure 6:
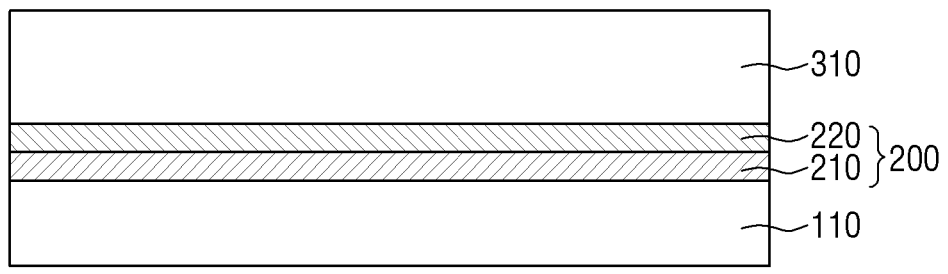

Specifically, referring to FIG. 6, the first semiconductor layer 310 may be formed on the second metal buffer layer 220. In the method of forming the first semiconductor layer 310, the first semiconductor layer 310 may be formed by growing a surface of the second metal buffer layer 220 by an epitaxial method. For example, the first semiconductor layer 310 may be formed using the second metal buffer layer 220 as a seed layer.

In the method of forming the first semiconductor layer 310, the first semiconductor layer 310 may be formed using electron beam evaporation, physical vapor deposition (PVD), chemical vapor deposition (CVD), plasma laser deposition (PLD), dual-type thermal evaporation, sputtering, metal organic chemical vapor deposition (MOCVD), or the like. In an embodiment, the first semiconductor layer 310 may be formed by physical vapor deposition (PVD), but the disclosure is not limited thereto.

The first semiconductor layer 310 may be grown using the second metal buffer layer 220 as a buffer layer. The first semiconductor layer 310 may be formed by growing GaN on the second metal buffer layer 220. The growth temperature for forming the first semiconductor layer 310 may be adjusted to be lower than the phase transition temperature of the metal material included in the first and second metal buffer layers 210 and 220. Further, the growth temperature for forming the first semiconductor layer 310 may be adjusted to a temperature at which a glass substrate may not be damaged in case that the base substrate 110 includes the glass substrate. For example, the growth temperature for forming the first semiconductor layer 310 may have a temperature range of about 800° C. or lower.

As described above, the process for growing the first semiconductor layer 310 at a temperature lower than the phase transition temperature of the metal materials included in the first and second metal buffer layers 210 and 220 without damaging the glass substrate may be performed by physical vapor deposition (PVD). In other embodiments, the process for growing the first semiconductor layer 310 may be performed by RF sputtering or pulsed DC sputtering.

Figure 7:
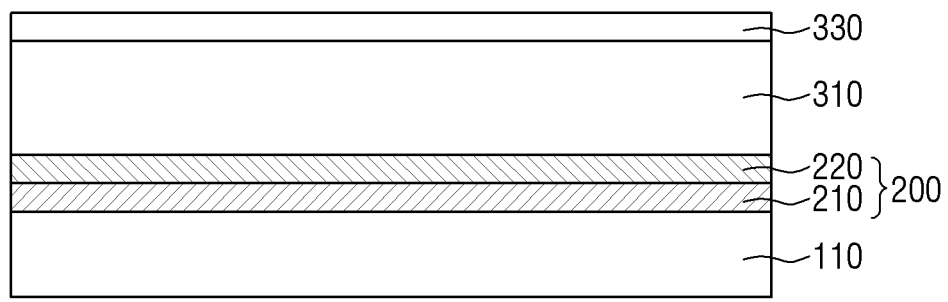

Subsequently, referring to FIG. 7, an active layer 330 may be formed on the first semiconductor layer 310. The active layer 330 may include a material having a single or multiple quantum well structure. In case that the active layer 330 includes a material having a multiple quantum well structure, the active layer 330 may have a structure in which quantum layers and well layers may be alternately stacked with each other. As described above, the active layer 330 may be formed by a process listed as the process for forming the first semiconductor layer 310.

Subsequently, referring to FIG. 1, a second semiconductor layer 320 may be formed on the active layer 330. The second semiconductor layer 320 may include GaN doped with a p-type dopant. Similarly, the second semiconductor layer 320 may also be formed by a process listed as the process for forming the first semiconductor layer 310.

According to the process of manufacturing the stacked structure 10 according to an embodiment, in case that the base substrate 110 includes an amorphous substrate, semiconductor layers may be grown on the base substrate 110 by controlling their directions and positions. Specifically, the first and second metal buffer layers 210 and 220 having a crystal structure may be formed on the base substrate 110, so that the first semiconductor layer 310 may be grown by reflecting the crystal structure of the first and second metal buffer layers 210 and 220. Accordingly, in the process of manufacturing the stacked structure 10 according to an embodiment, a semiconductor layer having high crystallinity may be grown even on the base substrate 110 that may be inexpensive and capable of large area, so that it may be possible to reduce the manufacturing cost for manufacturing a semiconductor device.

Figure 8:
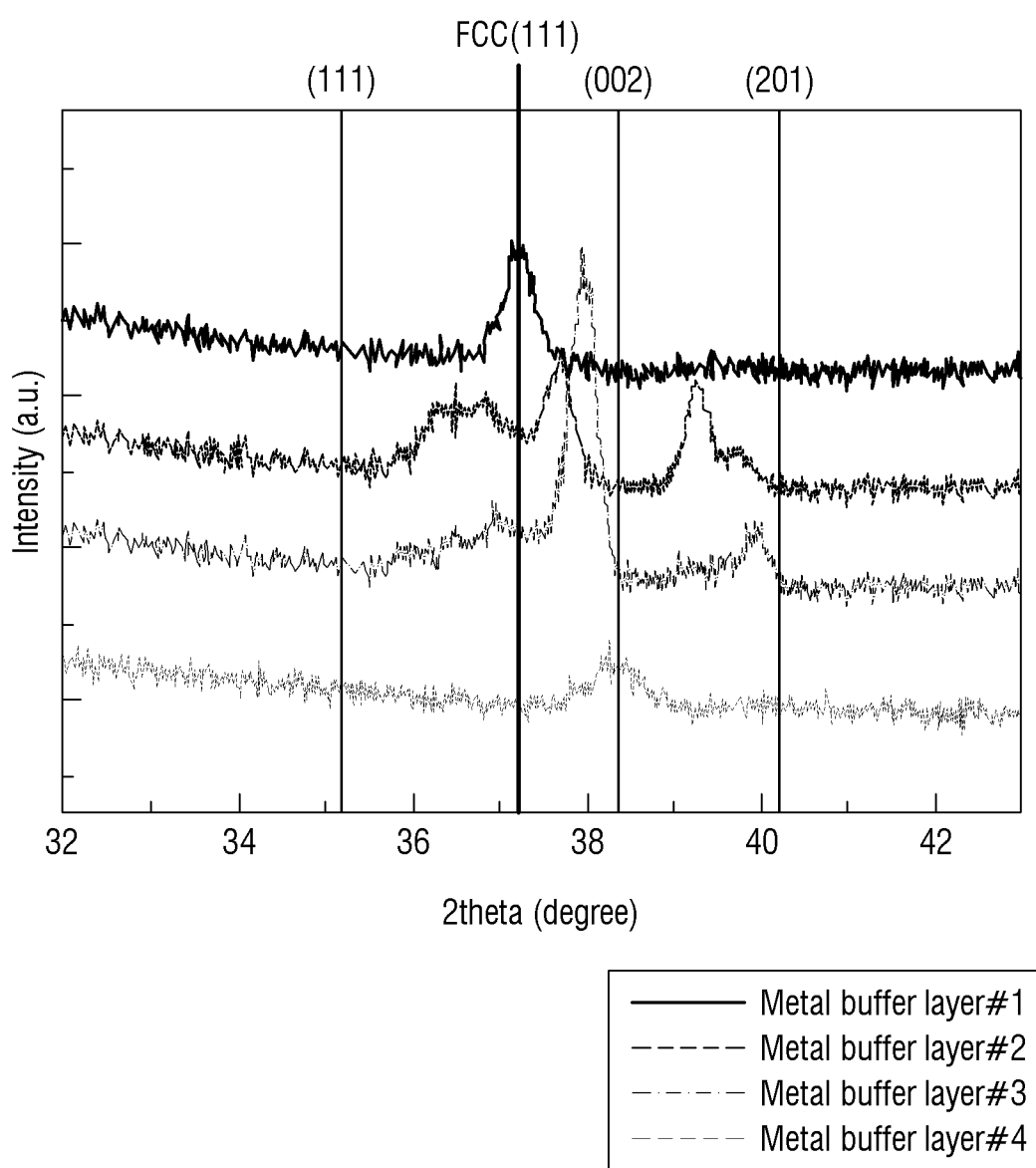
FIG. 8 is a schematic graph illustrating a pattern of analyzing a metal buffer layer formed on a base substrate with an X-ray diffraction analyzer (XRD)

FIG. 8 is a schematic graph illustrating a pattern of analyzing a metal buffer layer formed on a base substrate with an X-ray diffraction analyzer (XRD).

FIG. 8 is a schematic graph illustrating a pattern analyzed with an X-ray diffraction analyzer (XRD) for the result of forming a metal buffer layer containing Ti as a single layer by sputtering at a temperature of about 700° C. or less, which may be the maximum heat treatment temperature of a glass substrate, on an amorphous glass substrate. In FIG. 8. the metal buffer layer #1 may be obtained by forming a metal buffer layer containing Ti on a glass substrate as a single layer with a sputter power of about DC100 W at a process temperature of about 700° C. The metal buffer layer #2 may be obtained by forming a metal buffer layer containing Ti on a glass substrate as a single layer with a sputter power of about DC100 W at a process temperature of about 600° C. The metal buffer layer #3 may be obtained by forming a metal buffer layer containing Ti on a glass substrate as a single layer with a sputter power of about DC100 W at a process temperature of about 500° C. The metal buffer layer #4 may be obtained by forming a metal buffer layer containing Ti on a glass substrate as a single layer with a sputter power of about DC100 W. Referring to FIG. 8, it may be found that the crystal structure of the metal buffer layer #1 formed at about 700° C., which may be the maximum heat treatment temperature of the glass substrate, may be biased toward a FCC structure. In case that the crystal structure of the metal buffer layer has an FCC structure, it may be disadvantageous in the growth of the first semiconductor layer grown on the metal buffer layer by an epitaxial method.

Figure 9:
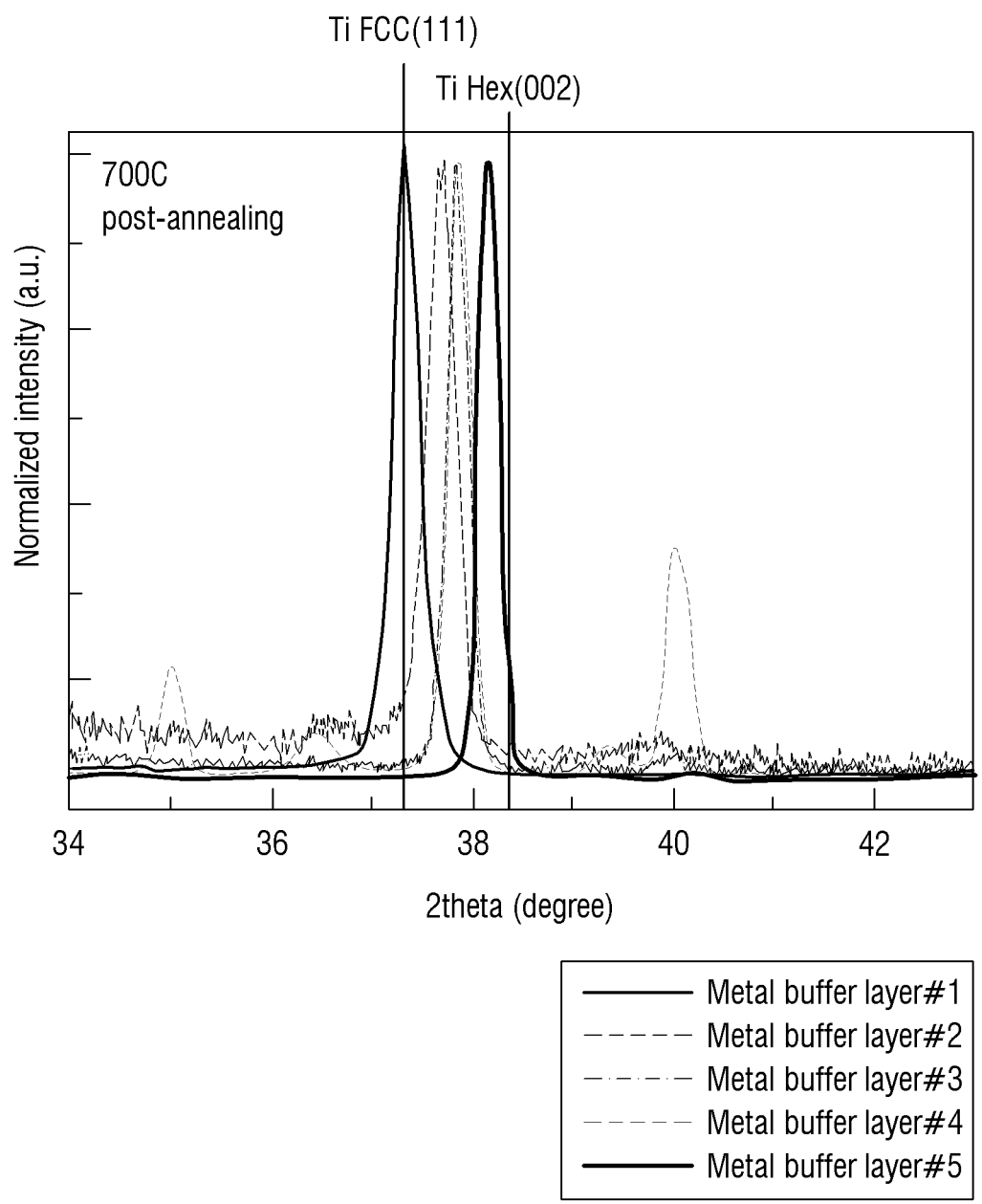
FIG. 9 is a schematic graph illustrating a pattern analyzed by an X-ray diffraction analyzer (XRD) in case that first and second metal buffer layers are formed as layers on a base substrate.

FIG. 9 is a schematic graph illustrating a pattern analyzed by an X-ray diffraction analyzer (XRD) in case that first and second metal buffer layers are formed as layers on a base substrate.

FIG. 9 is a schematic graph illustrating a pattern analyzed with an X-ray diffraction analyzer (XRD) for the result of forming a metal buffer layer containing Ti as a single layer or double layers by sputtering at a temperature of about 700° C. or less, which may be the maximum heat treatment temperature of a glass substrate, on an amorphous glass substrate. In FIG. 9. the metal buffer layer #1 may be obtained by forming a metal buffer layer containing Ti on a glass substrate as a single layer at a process temperature of about 700° C. The metal buffer layer #2 may be obtained by forming a metal buffer layer containing Ti on a glass substrate as double layers with about hp-Ti(700s)/Ti at a process temperature of about 700° C. The metal buffer layer #3 may be obtained by forming a metal buffer layer containing Ti on a glass substrate as double layers with about hp-Ti(2100s)/Ti at a process temperature of about 700° C. The metal buffer layer #4 may be obtained by forming a metal buffer layer containing Ti on a glass substrate as double layers with about hp-Ti(4200s)/Ti at a process temperature of about 700° C. The metal buffer layer #5 may be obtained by forming a metal buffer layer containing Ti on a glass substrate as double layers with about hp-Ti(6300s)/Ti at a process temperature of about 700° C. In the specification, about hp-Ti (700s) may mean that a metal buffer layer including Ti may be deposited for about 700 seconds at high power. For example, hp may refer to high power, and the number in parentheses may refer to process time for depositing the metal buffer layer containing Ti. As shown in FIG. 9, it may be found that the metal buffer layer #1 formed as a single layer has a crystal structure of FCC, and each of the metal buffer layer #2, the metal buffer layer #3, the metal buffer layer #4, and the metal buffer layer #5 formed as double layers has a crystal structure of Hex (or HCP) without being biased toward FCC. Accordingly, the metal buffer layer may be formed as double layers in two steps, thereby improving the crystallinity of the first semiconductor layer even in case that the base substrate is a glass substrate.

Hereinafter, a light emitting element formed by using the aforementioned stacked structure 10 including the base substrate 110, the metal buffer layer 200, and the semiconductor structure 300, and/or a display device including the light emitting element will be described. A case where the stacked structure 10 may be applied to a light emitting element and/or a display device including the light emitting element will be described as an example, but the disclosure is not limited thereto, and the aforementioned stacked structure 10 may be applied to various semiconductor devices.

Figure 10:
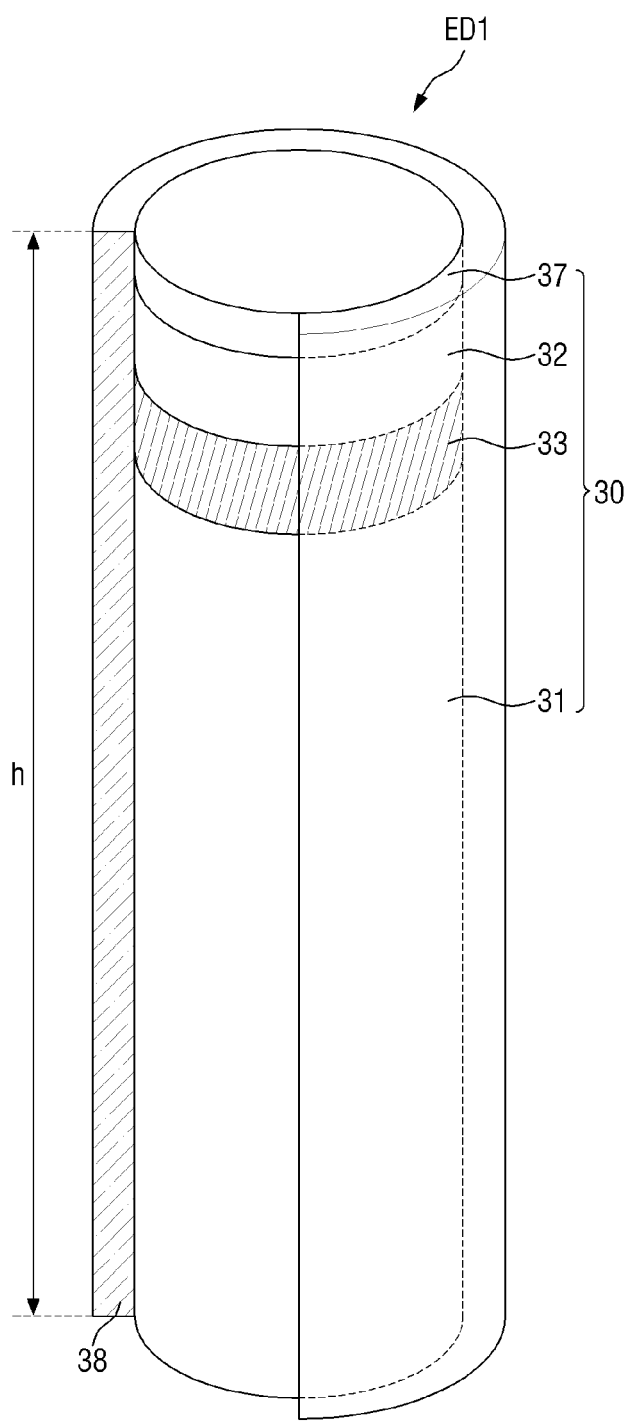
FIG. 10 is a schematic view of a light emitting element according to an embodiment.

FIG. 10 is a schematic view of a light emitting element according to an embodiment.

Referring to FIG. 10, a first light emitting element ED1 according to an embodiment may be a particulate element, and may have a rod shape or a cylindrical shape having a predetermined aspect ratio. The length of the first light emitting element ED1 may be larger than the diameter of the first light emitting element ED1, and the aspect ratio thereof may be 6:5 to 100:1, but is not limited thereto.

The first light emitting element ED1 may have a size of a nano-meter scale (about 1 nm or more and less than about 1 μm) to a micrometer scale (about 1 μm or more and less than about 1 mm). In an embodiment, both diameter and length of the first light emitting element ED1 may have a size of a nanometer scale, or may have a size of a micrometer scale. In some embodiments, the diameter of the first light emitting element ED1 may have a size of a nanometer scale, while the length of the first light emitting element ED1 may have a size of a micrometer scale. In some embodiments, some of the first light emitting element ED1 may have a size of a nanometer scale in diameter and/or length, while others of the first light emitting element ED1 may have a size of a micrometer scale in diameter and/or length.

In an embodiment, the first light emitting element ED1 may be an inorganic light emitting diode. The inorganic light emitting diode may include semiconductor layers. For example, the inorganic light emitting diode may include a first conductive (for example, n-type) semiconductor layer, a second conductive (for example, p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons having reached the active semiconductor layer may be combined with each other to emit light.

In an embodiment, the above-described semiconductor layers may be sequentially stacked along the length direction of the first light emitting element ED1. As shown in FIG. 10, the first light emitting element ED1 may include a light emitting element core 30 and an insulating layer 38 surrounding the outer circumferential surface of the light emitting element core 30.

The light emitting element core 30 may include a first semiconductor 31, an element active layer 33, a second semiconductor 32, and an element electrode layer 37, which may be sequentially stacked in the length direction of the first light emitting element ED1. The first semiconductor 31, the element active layer 33, and the second semiconductor 32 may be the above-described first conductive semiconductor layer, active semiconductor layer, and second conductive semiconductor layer, respectively. Further, the first semiconductor 31, element active layer 33, and second semiconductor 32 of the first light emitting element ED1 may correspond to the first semiconductor layer 310, the active layer 330, and the second semiconductor layer 320, which have been described with reference to FIG. 1, respectively.

The first semiconductor 31 may be doped with a first conductive dopant. The first conductive dopant may be at least one of Si, Ge, Sn, or the like. In an embodiment, the first semiconductor 31 may be n-GaN doped with n-type Si.

The second semiconductor 32 may be disposed to be spaced apart from the first semiconductor 31 with the element active layer 33 interposed therebetween. The second semiconductor 32 may be doped with a second conductive dopant such as at least one of Mg, Zn, Ca, Se, or Ba. In an embodiment, the second semiconductor 32 may be p-GaN doped with p-type Mg.

The element active layer 33 may include a material having a single or multiple quantum well structure. As described above, the element active layer 33 may emit light by combination of an electron-hole pair according to an electric signal applied through the first semiconductor 31 and the second semiconductor 32. In some embodiments, the active layer 33 may have a structure in which semiconductor materials having high band gap energy and semiconductor materials having low band gap energy may be alternately stacked with each other, and may include other Group 3 to Group 5 semiconductor materials depending on the wavelength band of emitted light.

Light emitted from the element active layer 33 may be emitted not only to the outer surface of the first light emitting element ED1 in the length direction, but also to both side surfaces thereof. For example, the direction of light emitted from the element active layer 33 may not be limited to one direction.

The element electrode layer 37 may be disposed on the second semiconductor 32. The element electrode layer 37 may be in contact with the second semiconductor 32. The element electrode layer 37 may be an ohmic contact electrode, but is not limited thereto, and may be a Schottky contact electrode.

In case that ends of the first light emitting element ED1 are electrically connected to electrodes so as to apply electric signals to the first semiconductor 31 and the second semiconductor 32, the electrode layer 37 may be disposed between the second semiconductor 32 and the electrodes to reduce resistance. The element electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The element electrode layer 37 may include a semiconductor material doped with an n-type or p-type dopant.

The insulating layer 38 may be disposed to surround an outer peripheral surface of the light emitting element core 30. The insulating layer 38 may be disposed to surround at least an outer surface of the element active layer 33 and may extend in one direction in which the first light emitting element ED1 extends. The insulating layer 38 may perform a function of protecting the members. The insulating layer 38 may be made of a material having insulating properties, and may prevent an electric short that may occur in case that the element active layer 33 is in direct contact with an electrode through which an electric signal may be transmitted to the first light emitting element ED1. Further, since the insulating film 38 protects the outer peripheral surfaces of the first and second semiconductors 31 and 32 and the element active layer 33, it may be possible to prevent a decrease in light emission efficiency.

Hereinafter, a process of manufacturing the first light emitting element according to an embodiment will be described with reference to FIGS. 1 and 11 to 15.

FIGS. 11 to 15 are schematic cross-sectional views illustrating a process of manufacturing the first light emitting element of FIG. 10.

FIGS. 11 to 15 illustrate processes after the process of manufacturing the stacked structure 10 described above with reference to FIGS. 1 to 7. Hereinafter, the method or process conditions for forming the stacked structure 10 including the base substrate 110, the metal buffer layer 200, and the semiconductor structure 300 described above with reference to FIGS. 1 to 7 will be omitted, and the order of the method of manufacturing the first light emitting element ED1 and the stacked structure will be described in detail, as a process after forming the stacked structure 10.

First, referring to FIG. 11, a stacked structure 10 including a base substrate 110, a metal buffer layer 200 formed on the base substrate 110, and a semiconductor structure 300 formed on the metal buffer layer 200 may be prepared.

Specifically, referring to FIG. 11, an electrode material layer 370 may be formed on a second semiconductor layer 320 of the stacked structure 10 using electron beam evaporation, physical vapor deposition (PVD), chemical vapor deposition (CVD), plasma laser deposition (PLD), dual-type thermal evaporation, sputtering, metal organic chemical vapor deposition (MOCVD), or the like, but the disclosure is not limited thereto.

The first semiconductor layer 310, active layer 330, and second semiconductor layer 320 included in the semiconductor structure 300 may correspond to the first semiconductor 31, element active layer 33, and second semiconductor 32 of the first light emitting element ED1, respectively. Specifically, the first semiconductor layer 310, the active layer 330, the second semiconductor layer 320, and the electrode material layer 370 may be layers including the same materials as the first semiconductor 31, element active layer 33, the second semiconductor 32, and element electrode layer 37 of the first light emitting element ED1.

Subsequently, the semiconductor structure 300 and the electrode material layer 370 may be vertically etched to form light emitting element cores 30 spaced apart from each other.

Specifically, referring to FIG. 12, a vertical direction in which the semiconductor structure 300 and the electrode material layer 370 may be etched may be parallel to the stacking direction of the layers. The semiconductor structure 300 and the electrode material layer 370 may be etched by an etching method. For example, an etching mask layer may be formed on the electrode material layer 370, and the semiconductor structure 300 and the electrode material layer 370 may be etched along the etching mask layer in a direction perpendicular to the base substrate 110. A space may be formed between the light emitting element cores 30 by the etching process. Further, the first and second metal buffer layers 210 and 220 may remain without being etched by the etching process.

For example, the etching process for forming the light emitting element core 30 spaced apart from each other may be formed by dry etching, wet etching, reactive ion etching (RIE), or inductively coupled plasma reactive ion etching (ICP-RIE). In the case of dry etching, anisotropic etching may be possible, so it may be suitable for vertical etching. In case of using the above-described etching method, an etchant may be $Cl_2$ or $O_2$. However, the disclosure is not limited thereto.

In some embodiments, the etching process for forming the light emitting element cores 30 may be performed by combination of dry etching and wet etching. For example, first, etching in the depth direction may be performed by dry etching, and wet etching, which may be isotropic etching, may be performed, to allow the etched sidewalls to be placed on a plane perpendicular to the surface.

Subsequently, an insulating material layer 380 may be formed on the light emitting element core 30.

Figure 13:
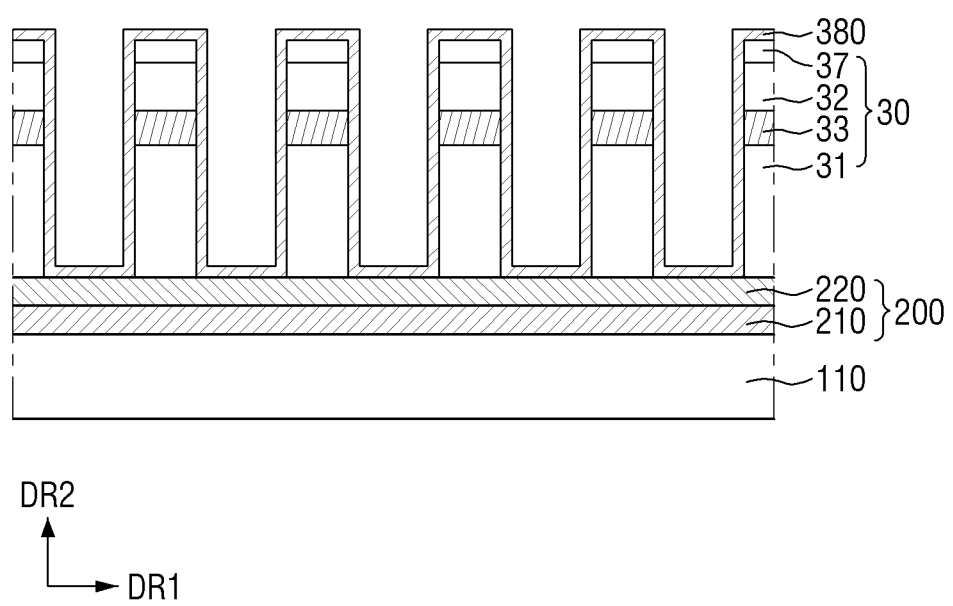

Specifically, referring to FIG. 13, the insulating material layer 380 may be formed entirely on the light emitting element core 30. The insulating material layer 380 may be formed on the side and upper surfaces of the light emitting element core 30 and the upper surface of the second metal buffer layer 220 exposed to the area between the light emitting element cores 30.

The insulating material layer 380 may be formed using a method of applying or immersing an inorganic material on the outer surface of the light emitting element core 30. However, the disclosure is not limited thereto. For example, the insulating material layer 380 may be formed by atomic layer deposition (ALD). Although it is shown in the drawing that the insulating material layer 380 may be formed as a single layer, the disclosure is not limited thereto. In case that the insulating material layer 380 has a multi-layer structure including insulating material layers, the insulating material layer 380 may be formed by sequentially stacking insulating layers.

Subsequently, a part of the insulating material layer 380 may be partially removed to form first light emitting elements ED1 on the metal buffer layer 200.

Figure 14:
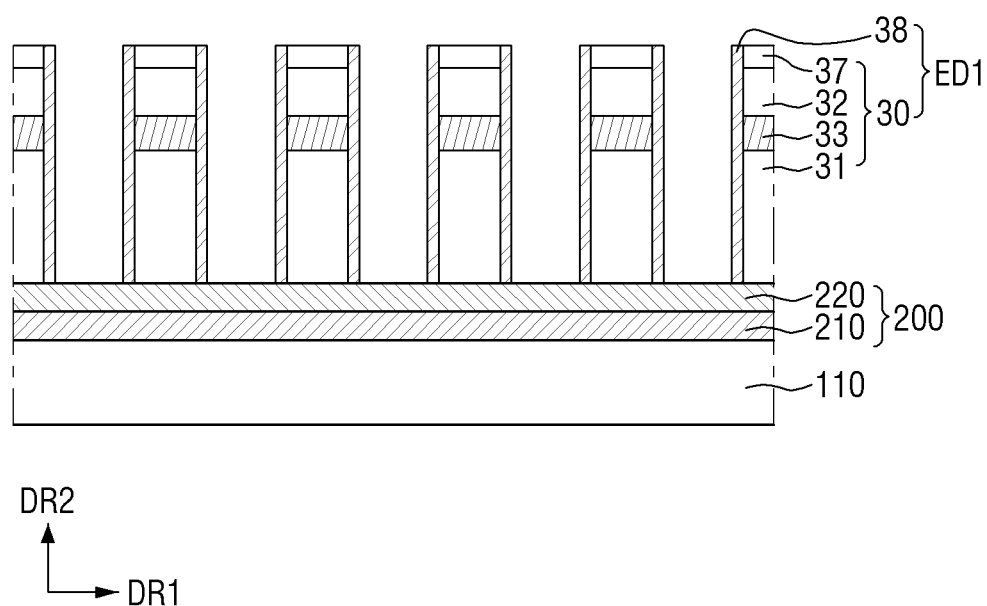

Specifically, referring to FIGS. 13 and 14, the insulating material layer 380 covering the upper and side surfaces of the light emitting element core 30 may be partially removed to form an insulating layer 38 exposing the upper surface of the light emitting element core 30 and surrounding the side surface of the light emitting element core 30. The process of partially removing the insulating material layer 380 may be performed by dry etching or back etching, which may be anisotropic etching. Through this etching process, the insulating material layer 380 disposed on the second metal buffer layer 220 exposed in the area where the light emitting cores 30 may be spaced apart from each other may be partially removed.

Subsequently, the first light emitting element ED1 may be separated from the base substrate 110.

Figure 15:
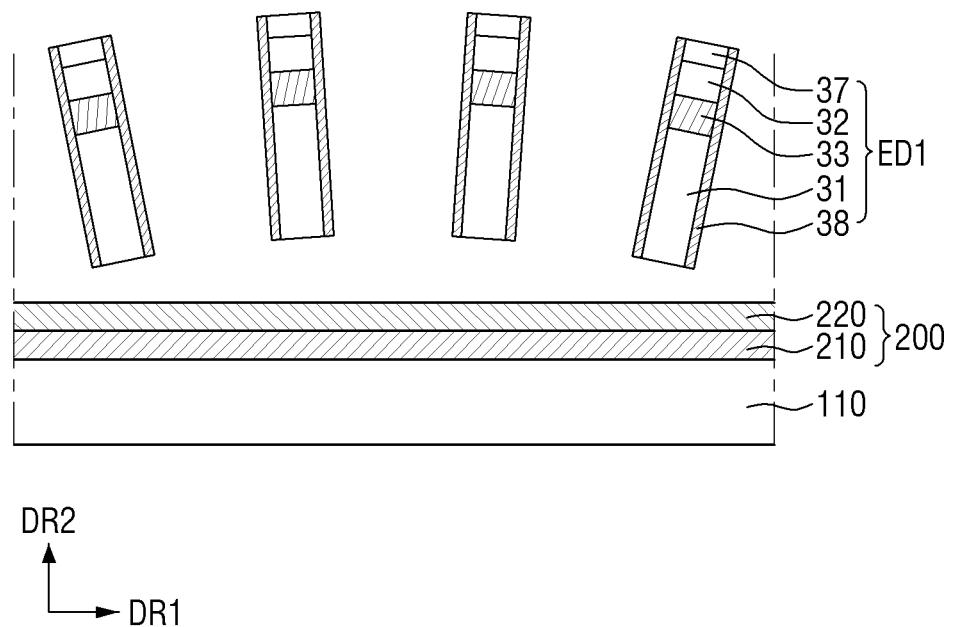

Specifically, referring to FIG. 15, a first light emitting element ED1 according to an embodiment may be manufactured by separating the first light emitting element ED1 from the base substrate 110, specifically, the second metal buffer layer 220. The method of separating the first light emitting device ED1 from the second metal buffer layer 220 is not particularly limited. The process of separating the first light emitting device ED1 from the second metal buffer layer 220 may be performed by a physical separation method or a chemical separation method.

In an embodiment, the first light emitting element ED1 including semiconductor layers may be formed by growth on the base substrate 110, which may be an amorphous substrate, by an epitaxial method. Specifically, the first light emitting element ED1 may be manufactured through a subsequent process after forming a semiconductor structure 300 including a base substrate 110, a metal buffer layer 200, first and second semiconductor layers 310 and 320, and an active layer 330. The first semiconductor layer 310 of the stacked structure 10 corresponding to the semiconductor layers included in the first light emitting device ED1, for example, the first semiconductor 31 including GaN, may be difficult to grow directly on the base substrate 110, which may be an amorphous substrate, by epitaxial method, and may be grown in any direction without orientation. Accordingly, in case that the base substrate 110 is an amorphous substrate, the first and second metal buffer layers 210 and 220 having a structure in which crystal grains may be aligned in a single direction regardless of the crystal structure of the base substrate 110 may be formed on the base substrate 110, so that seed crystals may be formed by the first and second metal buffer layers 210 and 220. Further, since the first and second metal buffer layers 210 and 220 having a crystalline structure may be formed on the base substrate 110, a difference in lattice constant between the base substrate 110 and the first semiconductor layer 310 may be reduced although the base substrate 110 may be an amorphous substrate, thereby improving manufacturing quality of the first light emitting element ED1. Since the first light emitting element ED1 may be manufactured using the base substrate 110 including a glass substrate less costly than a sapphire substrate, a silicon substrate, or a quartz substrate through the above-described process, manufacturing cost of the light emitting element may be reduced.

Figure 16:
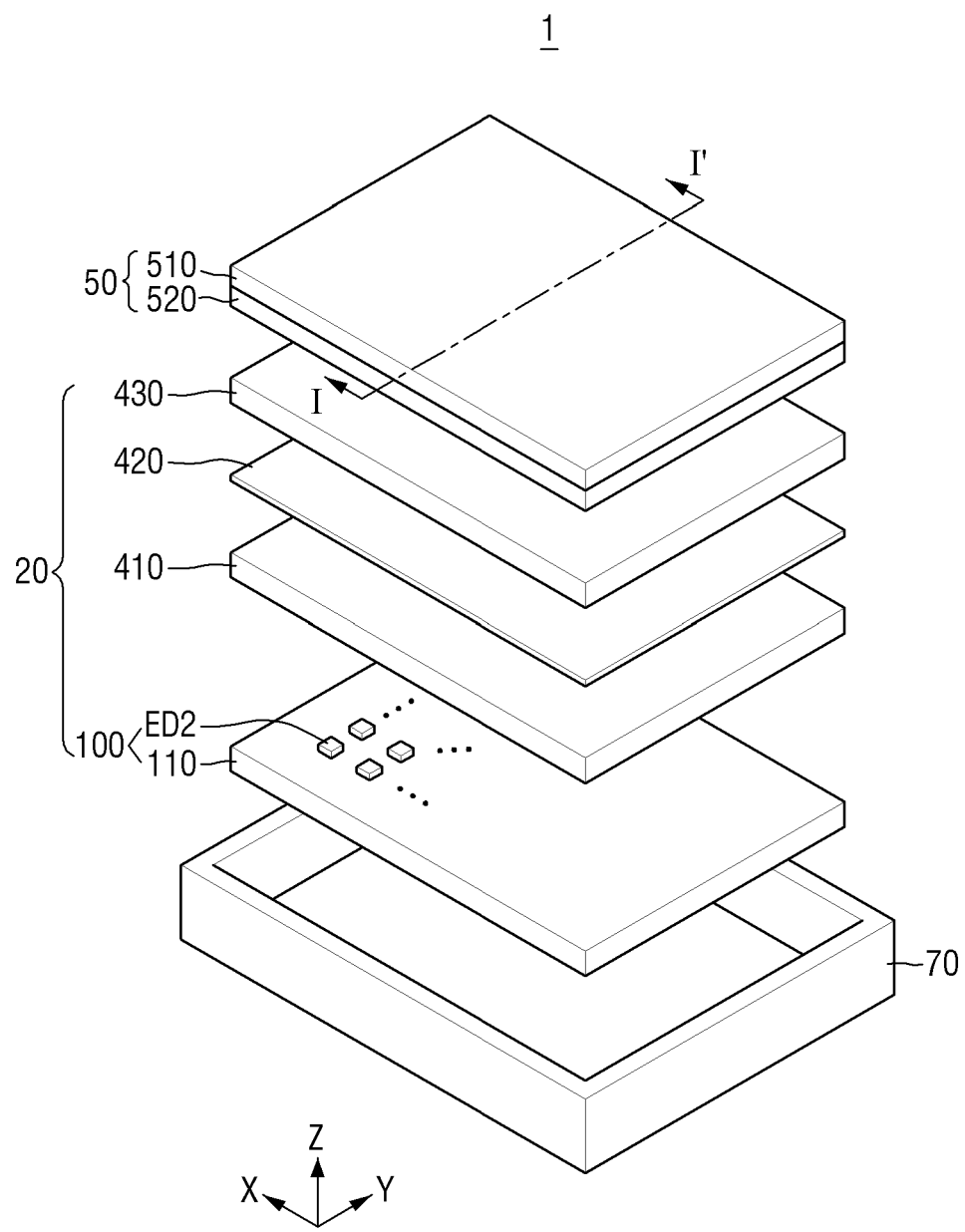
FIG. 16 is an exploded schematic perspective view of a display device according to an embodiment.
Figure 17:
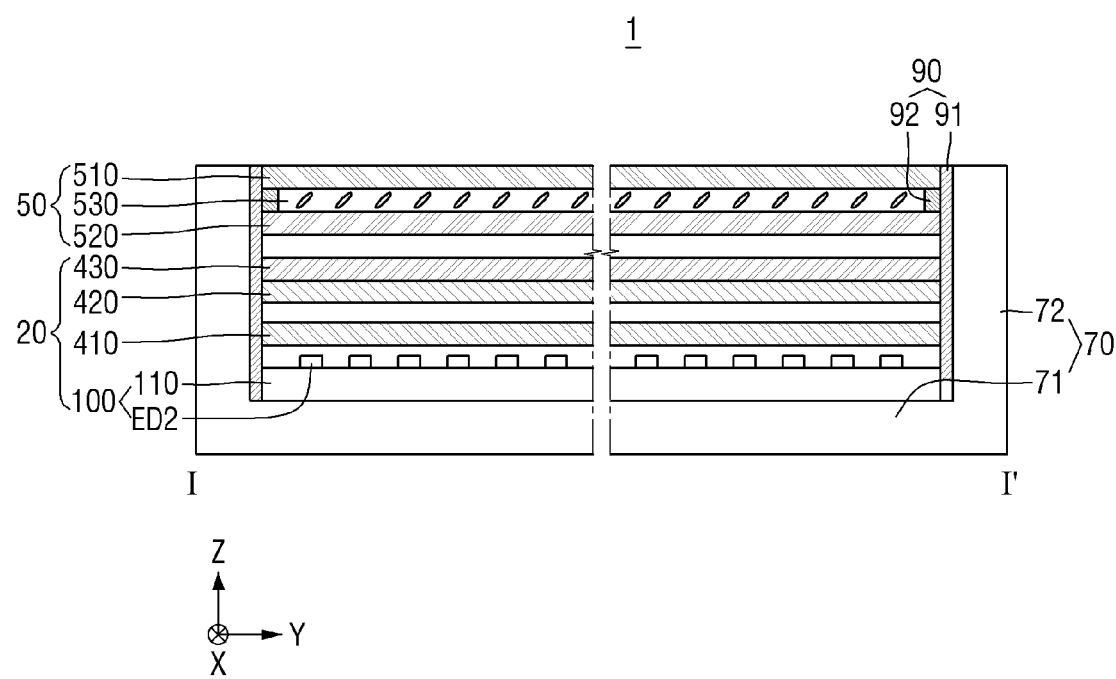
FIG. 17 is a schematic cross-sectional view of the display device taken along line I-I' of FIG. 16.

FIG. 16 is an exploded schematic perspective view of a display device according to an embodiment. FIG. 17 is a schematic cross-sectional view of the display device taken along line I-I' of FIG. 16.

Referring to FIGS. 16 and 17, a display device 1, which may be a device for display an image, may be applied to various electronic appliances such as televisions, external billboards, monitors, personal computers, notebook computers, tablet PCs, smart phones, car navigation units, cameras, center information displays (CIDs) for automobiles, wristwatch type electronic appliances, personal digital assistants (PDAs), portable multimedia players (PMPs), and game machines. These electronic appliances are only presented as examples, and the display device may be employed in other electronic appliances without departing from the concept of the disclosure.

Hereinafter, in the drawings for explaining the display device 1, a third direction X, a fourth direction Y, and a fifth direction Z are defined. The third direction X and the fourth direction Y may be directions perpendicular to each other in one plane. The fifth direction Z may be a direction perpendicular to a plane in which the third direction X and the fourth direction Y may be located. The fifth direction Z may be perpendicular to each of the third direction X and the fourth direction Y. In embodiments, the fifth direction Z represents a thickness direction of the display device 1.

Unless otherwise specified, the "upper" or "upper side" represents a thickness direction (upper side in the drawing) of the display device 1 in one side of the fifth direction Z, and likewise, the "upper surface" represents a surface facing one side in the fifth direction Z. Further, the "lower" or "lower side" represents a direction (lower side in the drawing) opposite to the thickness direction of the display device 1 in the other side of the fifth direction Z, and likewise, the "lower surface" represents a surface facing the other side in the fifth direction Z. These terms are spatially relative and should encompass other orientations such as may occur when a device is turned over, etc.

The display device 1 may have a rectangular shape including long sides in the third direction X and short sides in the fourth direction Y in a plan view. In a plan view, the corner where the long side of the display device 1 meets the short side of the display device 1 may have a right-angled shape, but the disclosure is not limited thereto, and may have a rounded curved shape. The planar shape of the display device 1 is not limited to the disclosed embodiment, and the display device 1 may have a square shape, a circular shape, an elliptical shape, or other polygonal shapes. The display surface of the display device 1 may be disposed at one side of the fifth direction Z, which may be a thickness direction.

The display device 1 may include a display panel 50, a light-emitting unit (e.g., a backlight unit) 20 disposed under the display panel 50 to provide light to the display panel 50, and a housing 70 accommodating the display panel 50 and the light-emitting unit 20. However, the disclosure is not limited thereto, and the display device 1 may omit any one of the members or include a larger number of members.

The display panel 50 may, in an embodiment, receive light emitted from the light-emitting unit 20 to display an image. In an embodiment, the display panel 50 may be a light-receiving display panel. For example, the display panel 50 may be a liquid crystal display panel, an electrowetting display panel, an electrophoretic display panel, or the like. However, the description of the display panel 50 is not limited to the above mentioned types but may be applied to any type of display panel.

The display panel 50 may include pixels. The pixels of the display panel 50 may be arranged in a matrix direction. The display panel 50 may include a switching element provided for each pixel, a pixel electrode, and a common electrode facing the pixel electrode.

As shown in FIG. 17, the display panel 50 may include an upper substrate 510, a lower substrate 520 facing the upper substrate 510, and a switching layer 530 disposed therebetween. The pixels of the display panel 50 may be arranged in a matrix direction. The display panel 50 may include a switching element provided for each pixel, a pixel electrode, and a common electrode facing the pixel electrode. The switching element and the pixel electrode may be disposed on the lower substrate 520, and the common electrode may be disposed on the upper substrate 510. However, the disclosure is not limited thereto, and the common electrode may also be disposed on the lower substrate 520. A sealing member 92 may be disposed at the edges of the upper substrate 510 and the lower substrate 520 to confine molecules of the switching layer 530 (e.g., in an embodiment, crystal molecules of a liquid crystal layer).

The light-emitting unit 20 may be disposed under the display panel 50. The light-emitting unit 20 may include a light source member 100, a wavelength conversion layer 410, a diffusion plate 420, and an optical film 430.

The light source member 100 may include a base substrate 110 and second light emitting elements ED2 disposed on the base substrate 110. The second light emitting element ED2 may emit light provided to the display panel 50. Light emitted from the second light emitting element ED2 may be incident on the overlying wavelength conversion layer 410.

The base substrate 110 may include an amorphous substrate. As described above, the base substrate 110 may include a glass substrate. The second light emitting elements ED2 may be disposed on the base substrate 110. Specifically, the second light emitting elements ED2 may be manufactured by performing a subsequent process on the stacked structure 10 including the semiconductor structure 300 formed on the above-described base substrate 110. Details thereof will be described later.

The wavelength conversion layer 410 may be disposed on the light source member 100 to overlap the light source member 100. The conversion layer 410 may be entirely disposed on the light source member 100 or may be partially disposed on the second light emitting elements ED2 to surround the second light emitting elements ED2. The wavelength conversion layer 410 may convert the wavelength of at least a part of incident light. In an embodiment, the wavelength conversion layer 410 may be disposed on the light source member 100 to be spaced apart from the light source member 100 in the fifth direction Z in a film form.

The wavelength conversion layer 410 may include a binder layer and wavelength conversion particles dispersed in the binder layer. The wavelength conversion layer 410 may further include scattering particles dispersed in the binder layer in addition to the wavelength conversion particles.

The binder layer may be a medium in which wavelength conversion particles may be dispersed, and may be made of various resin compositions. However, the disclosure is not limited thereto, and any medium capable of dispersing and distributing wavelength converting particles and/or scattering particles may be referred to as a binder layer regardless of its name, additional other functions, and constituent materials.

The wavelength conversion particle may be a particle that converts the wavelength of incident light, and may be, for example, a quantum dot (QD), a fluorescent material, or a phosphorescent material.

The wavelength conversion particles may include multiple wavelength conversion particles that convert incident light into light of different wavelengths. For example, the wavelength conversion particles may include first wavelength conversion particles that convert incident light of a specific wavelength into light of a first wavelength and emit the light of a first wavelength, and second wavelength conversion particles that convert incident light of a specific wavelength into light of a second wavelength and emit the light of a second wavelength.

The diffusion plate 420 may be disposed over the wavelength conversion layer 410. The diffusion plate 420 may be disposed to be spaced apart from the wavelength conversion layer 410 in the fifth direction Z. The diffusion plate 420 performs a function of diffusing light emitted from the wavelength conversion layer 410 to the display panel 50 to serve to provide the light emitted from the second light emitting element ED2 to the display panel 50 with more uniform luminance.

The diffusion plate 420 may include a light-transmitting material. For example, the diffusion plate 420 may include a material such as polymethyl methacrylate (PMMA), polystyrene (PS), polypropylene (PP), polyethylene terephthalate (PET), polycarbonate (PC), or a combination thereof. However, the material of the diffusion plate 420 is not limited thereto.

The optical film 430 may be disposed on the diffusion plate 420. The display device 1 may include at least one optical film 430, and the number thereof is not particularly limited. Although it is shown in the drawing that the optical film 430 is disposed to be spaced apart from the diffusion plate 420 and the display panel 50 in the fifth direction Z, the disclosure is not limited thereto. In some cases, the optical film 430 may be disposed to be in contact with the diffusion plate 420 and the display panel 50. The optical film 430 may perform optical functions such as condensing, refraction, diffusion, reflection, polarization and phase retardation for incident light. Examples of the optical film 430 may include a prism film, a microlens film, a lenticular film, a polarizing film, a reflective polarizing film, a retardation film, and a protective film.

The housing 70 may accommodate the light-emitting unit 20 and the display panel 50. The housing 70 may include a bottom chassis or bracket. Although not shown in the drawings, the housing 70 may further include a top chassis.

The housing 70 may include a bottom surface 71 and a side wall 72. The side wall 72 of the housing 70 may be connected to the bottom surface 71 thereof, and may be bent from the bottom surface 71 thereof in a vertical direction. The light source member 100 of the light-emitting unit 20 may be disposed on the bottom surface 71 of the housing 70. The diffusion plate 420 and optical film 430 of the backlight unit 20 and the display panel 50 may be fixed to the side wall 72 of the housing 70 through an adhesive tape 91. However, the disclosure is not limited thereto, and the above-described members may be mounted on another mounting structure of the housing 70 or may be mounted on or attached to a mold frame provided inside the housing 70.

Hereinafter, the light source member 100 will be described in detail.

FIG. 18 is an enlarged schematic cross-sectional view illustrating an example of a light source member included in a display device according to an embodiment.

Referring to FIG. 18, a light source member 100 according to an embodiment may include a base substrate 110, a metal buffer layer 200 disposed on the base substrate 110, and a second light emitting element ED2 formed on the metal buffer layer 200.

The base substrate 110 may include an amorphous substrate. For example, the base substrate 110 may include a glass or plastic substrate as an amorphous substrate. In an embodiment, the base substrate 110 may include a glass substrate.

The metal buffer layer 200 may be provided on the base substrate 110. The metal buffer layer 200 may include a first metal buffer layer 210 and a second metal buffer layer 220.

The first metal buffer layer 210 may be formed on the base substrate 110. The first metal buffer layer 210 may be formed to reduce a difference in lattice constant between the first semiconductor layer 31_1 of the second light emitting element ED2 and the base substrate 110 in order to form the second light emitting element ED2 on the base substrate 110, which may be an amorphous substrate having no crystal structure. The first metal buffer layer 210 may include a metal material having a hexagonal close-packed (HCP) structure or a face-centered cubic (FCC) structure as a crystal structure. The crystal structure of the first metal buffer layer 210 may include a hexagonal close-packed (HCP) structure. The first metal buffer layer 210 may include a metal having a small difference in lattice constant from the first semiconductor layer 31_1 of the second light emitting element ED2. The first metal buffer layer 210 may include at least one of the materials listed as materials that may be included in the first metal buffer layer 210 of the stacked structure 10 described above with reference to FIG. 1.

The second metal buffer layer 220 may be formed on the first metal buffer layer 210. The second metal buffer layer 220 may be used as a seed layer to form the stacked structure 10 including the semiconductor structure 300 of FIG. 1 for forming the second light emitting element ED2.

The second light emitting element ED2 may be disposed on the second metal buffer layer 220. The second light emitting element ED2 may include a first semiconductor layer 31_1, an element active layer 33_1, and a second semiconductor layer 321. The light emitting element ED1 may further include a first electrode 41 and a second electrode 42.

The first semiconductor layer 31_1, element active layer 33_1, and second semiconductor layer 32_1 of the second light emitting element ED2 may correspond to the first semiconductor layer 310, active layer 330, and second semiconductor layer 320 described above with reference to FIG. 1, respectively. The first semiconductor layer 31_1, element active layer 33_1, and second semiconductor layer 32_1 of the second light emitting element ED2 may include the same materials as the first semiconductor 31, element active layer 33, and second semiconductor 32 of the above-described first light emitting element ED1, respectively.

The second light emitting element ED2 may receive electric signals from an external device through the first electrode 41 formed on the first semiconductor layer 31_1 and the second electrode 42 formed on the second semiconductor layer 32_1. The first electrode 41 and the second electrode 42 may include a conductive material, and may thus transmit electric signals transmitted from an external device or a transistor to the first semiconductor layer 31_1 and the second semiconductor layer 32_1. However, the structure of the second light emitting element ED2 is not limited thereto, and in some embodiments, may have other structures.

In the optical member 100 according to an embodiment, after the first and second metal buffer layers 210 and 220 may be formed on the base substrate 110, the second light emitting element ED2 may be formed on the second metal buffer layer 220, thereby reducing a difference in lattice constant between the first semiconductor layer 31_1 of the second light emitting element ED2 and the base substrate 110. Further, second light emitting elements ED2 may be formed on the base substrate 110 including a glass substrate, and the second light emitting elements ED may be used as the light source member 100, thereby omitting a process of separating and reassembling the second light emitting elements ED2 from the base substrate 110 having the second light emitting elements ED2 formed thereon. For example, the base substrate 110 including the glass substrate may be used as the base substrate 110 in the process of forming the second light emitting element ED2 and simultaneously used as the light source member 100 of the display device 1, thereby improving the manufacturing efficiency of the display device 1. Further, a glass substrate less costly than a sapphire substrate, a silicon substrate or a quartz substrate may be used as the base substrate 110 for forming the second light emitting element ED2, so that the manufacturing cost of the display device 1 may be reduced.

FIG. 19 is an enlarged schematic cross-sectional view illustrating another example of a light source member included in a display device according to an embodiment.

Referring to FIG. 19, a light source member 100_1 according to an embodiment may be different from the light source member 100 of FIG. 18 in that the first electrode 41 may be disposed on the second metal buffer layer 220.

Specifically, the first electrode 41 may be formed on the second metal buffer layer 220. As described above, since the second metal buffer layer 220 includes a metal material, it may function as an electrode for applying an electric signal to the first semiconductor layer 31_1 formed on the second metal buffer layer 220. Accordingly, the first electrode 41 may be formed on the second metal buffer layer 220, thereby applying electric signals to the second light emitting element ED2_1 through the first electrode 41 and the second metal buffer layer 220. The first electrode 41 may be omitted.

In an embodiment, the first electrode 41 may be formed on the second metal buffer layer 220, so that the second metal buffer layer 220 may be used as an electrode for applying an electric signal to the second light emitting element ED2_1. The second metal buffer layer 220 aligned in a single orientation and formed by an epitaxial method may have excellent electrical conductivity as compared with a metal layer aligned in multiple orientations. Accordingly, the light emission performance of the second light emitting element ED2_1 using the second metal buffer layer 220 as an electrode may be improved.

Although embodiments have been disclosed for illustrative purposes, those skilled in the art will appreciate that various modifications, additions and substitutions are possible, without departing from the scope and spirit of the disclosure.

What is claimed is:

1. A stacked structure, comprising:
an amorphous substrate;
a first metal buffer layer disposed directly on an upper surface of the amorphous substrate;
a second metal buffer layer disposed on the first metal buffer layer; and
a semiconductor structure disposed on the second metal buffer layer,
wherein the semiconductor structure comprises:
a first semiconductor layer disposed on the second metal buffer layer;
an active layer disposed on the first semiconductor layer; and
a second semiconductor layer disposed on the active layer.

2. The stacked structure of claim 1, wherein the amorphous substrate includes a glass substrate.

3. The stacked structure of claim 1, wherein the first metal buffer layer includes at least one of Be, Al, Sc, Ti, V, Cr, Mn, Fe, Co, Ni, Cu, Zn, Sr, Y, Zr, Nb, Mo, Tc, Ru, Rh, Pd, Ag, Cd, In, Sn, Sb, Hf, Ta, W, Re, Os, Lr, Pt, Au, Hg, Pb, TI, a combination thereof, and a nitride thereof.

4. The stacked structure of claim 1, wherein the second metal buffer layer includes at least one of Be, Al, Sc, Ti, V, Cr, Mn, Fe, Co, Ni, Cu, Zn, Sr, Y, Zr, Nb, Mo, Tc, Ru, Rh, Pd, Ag, Cd, In, Sn, Sb, Hf, Ta, W, Re, Os, Lr, Pt, Au, Hg, Pb, TI, a combination thereof, and a nitride thereof.

5. The stacked structure of claim 1, wherein the second metal buffer layer has a hexagonal crystal structure.

* * * * *